United States Patent
Birenbaum et al.

(10) Patent No.: US 12,085,935 B2
(45) Date of Patent: Sep. 10, 2024

(54) OPEN DOOR RECONSTRUCTION FOR SENSOR SIMULATION

(71) Applicant: WAYMO LLC, Mountain View, CA (US)

(72) Inventors: Evan Birenbaum, Mountain View, CA (US); Xiaoyi Liu, Mountain View, CA (US)

(73) Assignee: Waymo LLC, Mountain View, CA (US)

(*) Notice: Subject to any disclaimer, the term of this patent is extended or adjusted under 35 U.S.C. 154(b) by 357 days.

(21) Appl. No.: 17/389,626

(22) Filed: Jul. 30, 2021

(65) Prior Publication Data

US 2023/0031130 A1    Feb. 2, 2023

(51) Int. Cl.
*G06T 17/30* (2006.01)
*G05D 1/00* (2006.01)
*G07C 5/04* (2006.01)

(52) U.S. Cl.
CPC ............. *G05D 1/0088* (2013.01); *G07C 5/04* (2013.01)

(58) Field of Classification Search
CPC .............. G05D 1/0088; G06F 11/3664; G06F 11/3684; G06F 30/15; G06F 30/20; G07C 5/04; G06T 17/30; G06T 2207/30248; G06T 2210/12; G06T 7/40; G06T 7/251; G06T 7/344

See application file for complete search history.

(56) References Cited

U.S. PATENT DOCUMENTS

| | | | |
|---|---|---|---|
| 2019/0243371 A1* | 8/2019 | Nister | G05D 1/0231 |
| 2019/0278292 A1* | 9/2019 | Levinson | G06T 17/05 |
| 2019/0303759 A1 | 10/2019 | Farabet et al. | |
| 2021/0020031 A1* | 1/2021 | Herman | G08G 1/162 |
| 2021/0076008 A1 | 3/2021 | Seyfi et al. | |
| 2021/0125052 A1 | 4/2021 | Tremblay et al. | |
| 2022/0366703 A1* | 11/2022 | Sheng | G06V 10/98 |

\* cited by examiner

*Primary Examiner* — Matthew J. Reda
(74) *Attorney, Agent, or Firm* — Botos Churchill IP Law

(57) ABSTRACT

Aspects of the disclosure relate to generating assets for a simulation in order to test autonomous vehicle control software. For instance, data identifying a vehicle object, a polygon for the vehicle object, and a polygon for an open-door object associated with the vehicle object may be received. A rectangle may be fit to the polygon for the vehicle object. A polygon for the vehicle object without the open-door object may be determined based on the rectangle. A vehicle asset representing a vehicle may be adjusted based on the polygon for the vehicle object without the open-door object. A position and rotation of the rectangle may be used to position an open-door asset representing an open door for the simulation. The open-door asset is adjusted based on the adjustment to the vehicle asset. The simulation may be run with the positioned and adjusted open door asset in order to test the autonomous vehicle control software.

20 Claims, 13 Drawing Sheets

OPEN DOOR RECONSTRUCTION FOR SENSOR SIMULATION

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location, for instance, by determining and following a route which may require the vehicle to respond to and interact with other road users such as vehicles, pedestrians, bicyclists, etc. The autonomous control software used by these vehicles to operate in the autonomous mode may sometimes be tested and validated before such software is actually used to control the vehicles in areas where the vehicles are interacting with other objects.

Such testing may often involve simulations which may include simulations which are run using log data collected by a vehicle operating in an autonomous mode over some brief period of time. The log data may include information from the vehicle's various systems including perception, routing, planning, positioning, etc. At the same time, the actual vehicle is replaced with a simulated vehicle which can make decisions using the autonomous control software. By doing so, the software can be rigorously tested. For instance, the simulations may be used to determine whether a particular type of event or interaction with another agent has occurred, such as a particular type of behavior, collision, or near collision. As an example, these events and interactions may be used for various purposes, such as determining whether the software can be rigorously tested to determine whether the software can "pass" a given simulation without a collision or near collision without requiring a vehicle to physically drive "real" miles or having to "manufacture" situations in the real world.

BRIEF SUMMARY

Aspects of the disclosure provide a method of generating assets for a simulation in order to test autonomous vehicle control software. The method includes receiving, by one or more processors, data identifying a vehicle object, a polygon for the vehicle object, and a polygon for an open-door object associated with the vehicle object; fitting, by the one or more processors, a rectangle to the polygon for the open-door object; determining, by the one or more processors, a polygon for the vehicle object without the open-door object based on the rectangle; adjusting, by the one or more processors, a vehicle asset representing a vehicle based on the polygon for the vehicle object without the open-door object; using, by the one or more processors, a position and rotation of the rectangle to position an open-door asset representing an open door for the simulation; adjusting, by the one or more processors, the open-door asset based on the adjustment to the vehicle asset; and running, by the one or more processors, the simulation with the positioned and adjusted open door asset in order to test the autonomous vehicle control software.

In one example, the positioning of the open-door asset occurs before the adjusting of the open-door asset. In another example, the positioning of the open-door asset occurs after the adjusting of the open-door asset. In another example, the method also includes receiving sensor data points corresponding to the vehicle object and the open-door object, and the determining the polygon for the vehicle object without the open-door object based on the rectangle also includes removing ones of the sensor data points within the rectangle. In another example, the method also includes receiving sensor data points corresponding to the vehicle object and the open-door object, and the determining the polygon for the vehicle object without the open-door object based on the rectangle also includes increasing a size of the rectangle and removing ones of the sensor data points within the rectangle having the increased size. In another example, the data is log data generated by a vehicle collecting data while driving in an autonomous driving mode. In another example, the data is simulated log data generated in part by human operators. In another example, the polygon for the vehicle object without the open-door object is a second rectangle.

Another aspects of the disclosure provides a system for generating assets for a simulation in order to test autonomous vehicle control software. The system includes one or more processors configured to: receive data identifying a vehicle object, a polygon for the vehicle object, and a polygon for an open-door object associated with the vehicle object; fit a rectangle to the polygon for the open-door object; determine a polygon for the vehicle object without the open-door object based on the rectangle; adjust a vehicle asset representing a vehicle based on the polygon for the vehicle object without the open-door object; use a position and rotation of the rectangle to position an open-door asset representing an open door for the simulation; adjust the open-door asset based on the adjustment to the vehicle asset; and run the simulation with the positioned and adjusted open door asset in order to test the autonomous vehicle control software.

In one example, the one or more processors are also configured to position the open-door asset occurs before adjusting the open-door asset. In another example, the one or more processors are also configured to position the open-door asset occurs after adjusting the open-door asset. In another example, the one or more processors are also configured to receive sensor data points corresponding to the vehicle object and the open-door object, and to determine the polygon for the vehicle object without the open-door object based on the rectangle also by removing ones of the sensor data points within the rectangle. In another example, the one or more processors are also configured to, receive sensor data points corresponding to the vehicle object and the open-door object, and to determine the polygon for the vehicle object without the open-door object based on the rectangle also by: increasing a size of the rectangle; and removing ones of the sensor data points within the rectangle having the increased size. In another example, the data is log data generated by a vehicle collecting data while driving in an autonomous driving mode. In another example, the data is simulated log data generated in part by human operators. In another example, the polygon for the vehicle object without the open-door object is a second rectangle.

A further aspect of the disclosure provides a non-transitory recording medium on which instructions are stored. The instructions, when executed by one or more processors, cause the one or more processors to perform a method of generating assets for a simulation in order to test autonomous vehicle control software. The method includes: receiving data identifying a vehicle object, a polygon for the vehicle object, and a polygon for an open-door object associated with the vehicle object; fitting a rectangle to the polygon; determining a polygon for the vehicle object without the open-door object based on the rectangle; adjusting a vehicle asset representing a vehicle based on the polygon for the vehicle object without the open-door object; using a position and rotation of the rectangle to position an open-door asset representing an open door for the simulation; adjusting the open-door asset based on the adjustment to the vehicle asset; and running the simulation with the positioned and adjusted open door asset in order to test the autonomous vehicle control software.

In one example, the method further comprises, receiving sensor data points corresponding to the vehicle object and the open-door object, and the determining the polygon for the vehicle object without the open-door object based on the rectangle includes removing ones of the sensor data points within the rectangle. In another example, the method further includes, receiving sensor data points corresponding to the vehicle object and the open-door object, and the determining the polygon for the vehicle object without the open-door object based on the rectangle includes: increasing a size of the rectangle; and removing ones of the sensor data points within the rectangle having the increased size. In another example, the data is log data generated by a vehicle collecting data while driving in an autonomous driving mode.

DETAILED DESCRIPTION

Overview

Figure 1:
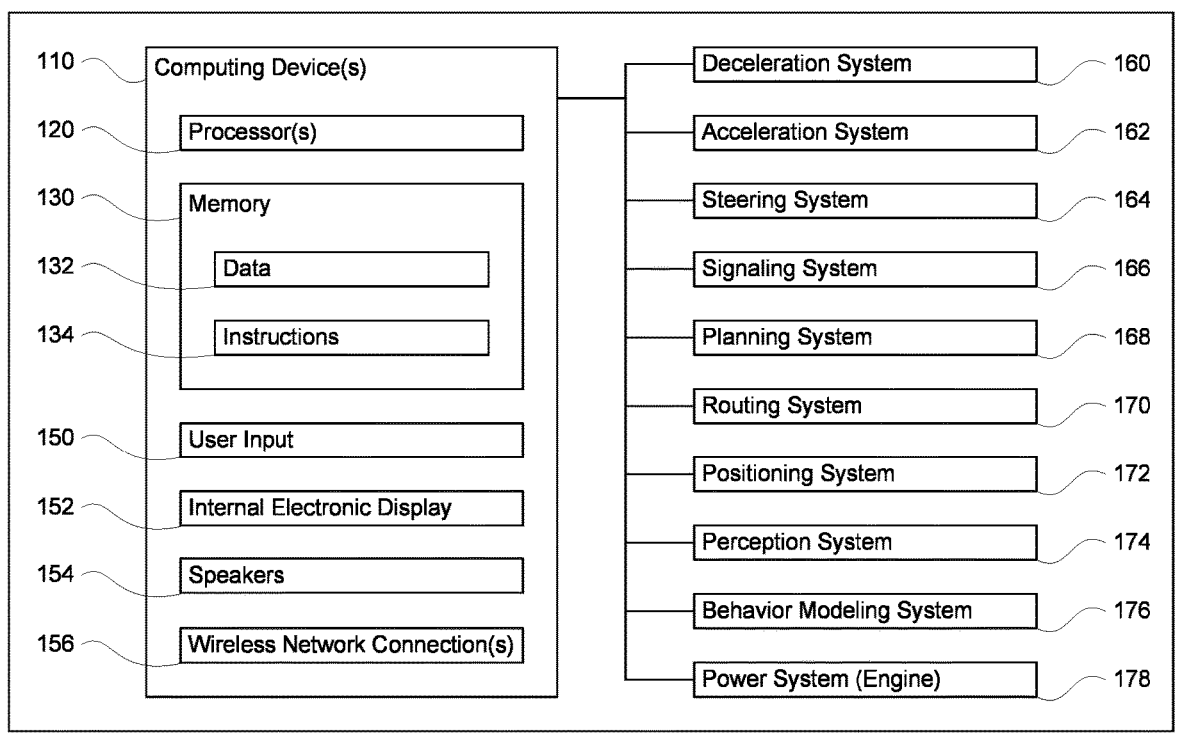
FIG. 1 is a functional diagram of an example vehicle in accordance with an exemplary embodiment.

The technology relates to sensor simulations for autonomous vehicles involving other vehicles having open doors. As noted above, these simulations may be log-based, generated from other/simulated data, or a combination of these. Log-based simulations correspond to simulations which are run using log data segments collected by an autonomous vehicle operating in an autonomous or manual driving mode over some brief period of time such as 1 minute or more or less. The log data may include information from the autonomous vehicle's various systems including perception, routing, planning, positioning, etc. At the same time, the actual vehicle is replaced with a simulated autonomous vehicle which can make decisions using software for controlling the vehicle autonomously. By doing so, the software can be rigorously tested.

In order to make the testing more useful, the simulations themselves should be as realistic as possible. Thus, a virtual scene may be reconstructed from the aforementioned log-data (and/or other simulated data) so that objects in the simulated autonomous vehicle's environment can be positioned relative to the simulated autonomous vehicle as they were to the autonomous vehicle that collected the log data. In this regard, the log data may identify the relative position, orientation, size and shape or contour of vehicle objects. The size shape and contour of the vehicle object may be represented by a three-dimensional bounding box representing the volume of space occupied by an object, a polygon representing the contour (e.g. top-down contour) for the vehicle object, as well as the three-dimensional sensor data points corresponding to that object. The labels themselves may be generated and applied by an autonomous vehicle's perception system, for instance, using machine learned models trained on human labeled data. Alternatively, if the simulation is based on simulated data, the label identifying an open door may be applied by a human operator.

In this regard, when constructing a scene for a simulation, for each vehicle to be represented in the scene, the simulation system may use the dimensions of the bounding box for a vehicle object to select a vehicle asset representing a vehicle object from a plurality of vehicle assets pre-stored in a storage system. The size of the vehicle asset may then be adjusted to a size that best fits the bounding box, and the adjusted vehicle asset may be placed into the scene for the simulation. The adjustment may include increasing or decreasing one or more of the length, width, or height of the vehicle.

In some instances, the log data may include a label identifying whether or not the vehicle has an open door as well as a three-dimensional bounding box representing the volume of space occupied by the open-door object as well as a polygon representing the contour (e.g. top-down contour) for the vehicle object. In this regard, the bounding box for the vehicle object may also include three-dimensional data points for an open-door object. As such, the simulation system may analyze the labels for such vehicle objects in the log data and determine whether the vehicle objects include an open door. If so, the simulation system may attempt to create a representation of those open doors for the simulation. Current approaches may involve placing another object, such as a smaller vehicle object or other generic placeholder object, in the space adjacent to the vehicle object in the simulation. However, these approaches may not provide the requisite realism for adequately testing an autonomous vehicle.

To address this, once the simulation system has determined that a vehicle object has an open door, the simulation system may determine the properties of the door (e.g. which door and how far open) in order to better represent the open door in the scene. To do so, a rectangle may be fit to the contour polygon representing the door. In other words, a smallest rectangle that fits around the polygon may be determined. The position and rotation of the rectangle may be used as a proxy for the properties of the open-door object in the simulation as discussed further below.

Because the polygon representing the vehicle object also includes the door object, the two must be distinguished or separated out from one another in order to properly reconstruct the objects separately for the simulation. As such, vertices corresponding to the open door may be removed from the polygon representing the combined vehicle object and the door object. To do so, any vertices which fall into the space of the open-door rectangle (and/or the polygon) may be removed, filtered or otherwise discarded from the polygon representing the combined vehicle object and the door object. The remaining vertices may be used to draw a new polygon contour for the vehicle object (without the open-door object). This may result in a reduced or smaller polygon. In some instances, when removing sensor data points, the size of the rectangle may be increased by some small amount, such as 1, 5, 10, 15 centimeters or more or less, in order to ensure that vertices along the edges of the polygon representing the combined vehicle object and the door object are also captured within the rectangle and are removed.

As noted above, the simulation system may use the dimensions of the bounding box for the vehicle object without the open-door object to select a vehicle asset representing a vehicle object from a plurality of vehicle assets pre-stored in a storage system. The size of the vehicle asset may then be adjusted to a size that best fits the bounding box for the vehicle object without the open-door object, and the adjusted vehicle asset may be placed into the scene for the simulation. The adjustment may include increasing or decreasing one or more of the length, width, or height of the vehicle. The position and rotation of the bounding box for the vehicle object may be used to position the adjusted vehicle asset in the simulation.

In addition, the simulation system may then identify a door asset from the storage system based on a relationship with the vehicle asset for the vehicle object with the open door. This relationship may be a simple association (e.g. a pointer) but may also include other information such as the exact position for the door asset relative to the vehicle. For instance, the location of the open door relative to the vehicle (e.g. driver/left, rear/left, passenger/right, rear/right, etc.) may be used to select a specific door asset or simply how to flip/place the door asset relative to the vehicle. Before placing the door asset in the scene, the door asset may be adjusted using the same adjustment that was made to the vehicle asset. In this regard, the door asset may be properly sized for the vehicle asset in the scene. This may provide better, more realistic results than attempting to size the door asset to the sensor data points or bounding box itself. The position and rotation of the door rectangle may be used to position the adjusted door asset relative to the adjusted vehicle asset.

Once the door asset has been positioned relative to the vehicle asset, a simulation may then be run to test the autonomous vehicle control software using the vehicle asset, door asset, and the bounding box for the vehicle object without the open-door object.

The features described herein may enable more realistic simulations for autonomous vehicles involving other vehicles having open doors. The features described herein may provide for more consistency across simulations and therefore better, more consistent testing of autonomous vehicles. This may be especially useful for testing autonomous vehicles in dense urban areas where there may be vehicles parked on the sides of narrow roads, in order to enable engineers to develop autonomous vehicles which are better able to respond to open doors. Moreover, the features described herein also allow for more realistic simulations run using simulated open doors (e.g. those injected by human operators including engineers, etc.), this reduces the need for additional log data to be captured in order to test the autonomous vehicle control software in such situations.

Example Systems

As shown in FIG. 1, an autonomous vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing device 110 containing one or more processors 120, memory 130 and other components typically present in general purpose computing devices.

The memory 130 stores information accessible by the one or more processors 120, including data 132 and instructions 134 that may be executed or otherwise used by the processor 120. The memory 130 may be of any type capable of storing information accessible by the processor, including a computing device or non-transitory recording or computer-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 134 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 132 may be retrieved, stored or modified by processor 120 in accordance with the instructions 134. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processor 120 may be any conventional processors, such as commercially available CPUs or GPUs. Alternatively, the one or more processors may be a dedicated device such as an ASIC or other hardware-based processor. Although FIG. 1 functionally illustrates the processor, memory, and other elements of computing device 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing device 110.

Accordingly, references to a processor or computing device will be understood to include references to a collection of processors or computing devices or memories that may or may not operate in parallel.

Computing devices 110 may include all of the components normally used in connection with a computing device such as the processor and memory described above as well as a user input 150 (e.g., one or more button, mouse, keyboard, touch screen and/or microphone), various electronic displays (e.g., a monitor having a screen or any other electrical device that is operable to display information), and speakers 154 to provide information to a passenger of the autonomous vehicle 100 or others as needed. For example, electronic display 152 may be located within a cabin of autonomous vehicle 100 and may be used by computing devices 110 to provide information to passengers within the autonomous vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

The computing devices 110 may be part of an autonomous control system for the autonomous vehicle 100 and may be capable of communicating with various components of the vehicle in order to control the vehicle in an autonomous driving mode. For example, returning to FIG. 1, the computing devices 110 may be in communication with various systems of autonomous vehicle 100, such as deceleration system 160, acceleration system 162, steering system 164, signaling system 166, planning system 168, routing system 170, positioning system 172, perception system 174, behavior modeling system 176, and power system 178 in order to control the movement, speed, etc. of autonomous vehicle 100 in accordance with the instructions 134 of memory 130 in the autonomous driving mode.

As an example, the computing devices 110 may interact with deceleration system 160 and acceleration system 162 in order to control the speed of the vehicle. Similarly, steering system 164 may be used by computing devices 110 in order to control the direction of autonomous vehicle 100. For example, if autonomous vehicle 100 is configured for use on a road, such as a car or truck, the steering system may include components to control the angle of wheels to turn the vehicle. The computing devices 110 may also use the signaling system 166 in order to signal the vehicle's intent to other drivers or vehicles, for example, by lighting turn signals or brake lights when needed.

Routing system 170 may be used by the computing devices 110 in order to generate a route to a destination using map information. Planning system 168 may be used by computing device 110 in order to generate short-term trajectories that allow the vehicle to follow routes generated by the routing system. In this regard, the planning system 168 and/or routing system 166 may store detailed map information, e.g., pre-stored, highly detailed maps identifying a road network including the shape and elevation of roadways, lane lines, intersections, crosswalks, speed limits, traffic signals, buildings, signs, real time traffic information (updated as received from a remote computing device, as such as the computing devices 410 discussed below or other computing devices), pullover spots, vegetation, or other such objects and information.

In addition to the aforementioned physical feature information, the map information may be configured as a roadgraph which includes a plurality of graph nodes and edges representing road or lane segments that together make up the road network of the map information. Each edge is defined by a starting graph node having a specific geographic location (e.g. latitude, longitude, altitude, etc.), an ending graph node having a specific geographic location (e.g. latitude, longitude, altitude, etc.), and a direction. This direction may refer to a direction the autonomous vehicle 100 must be moving in in order to follow the edge (i.e. a direction of traffic flow). The graph nodes may be located at fixed or variable distances. For instance, the spacing of the graph nodes may range from a few centimeters to a few meters and may correspond to the speed limit of a road on which the graph node is located. In this regard, greater speeds may correspond to greater distances between graph nodes. The edges may represent driving along the same lane or changing lanes. Each node and edge may have a unique identifier, such as a latitude and longitude location of the node or starting and ending locations or nodes of an edge. In addition to nodes and edges, the map may identify additional information such as types of maneuvers required at different edges as well as which lanes are drivable.

The routing system 166 may use the aforementioned map information to determine a route from a current location (e.g. a location of a current node) to a destination. Routes may be generated using a cost-based analysis which attempts to select a route to the destination with the lowest cost. Costs may be assessed in any number of ways such as time to the destination, distance traveled (each edge may be associated with a cost to traverse that edge), types of maneuvers required, convenience to passengers or the vehicle, etc. Each route may include a list of a plurality of nodes and edges which the vehicle can use to reach the destination. Routes may be recomputed periodically as the vehicle travels to the destination.

The map information used for routing may be the same or a different map as that used for planning trajectories. For example, the map information used for planning routes not only requires information on individual lanes, but also the nature of lane boundaries (e.g., solid white, dash white, solid yellow, etc.) to determine where lane changes are allowed. However, unlike the map used for planning trajectories, the map information used for routing need not include other details such as the locations of crosswalks, traffic lights, stop signs, etc., though some of this information may be useful for routing purposes. For example, between a route with a large number of intersections with traffic controls (such as stop signs or traffic signal lights) versus one with no or very few traffic controls, the latter route may have a lower cost (e.g. because it is faster) and therefore be preferable.

Positioning system 170 may be used by computing devices 110 in order to determine the vehicle's relative or absolute position on a map or on the earth. For example, the positioning system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude, a location of a node or edge of the roadgraph as well as relative location information, such as location relative to other cars immediately around it which can often be determined with less noise that absolute geographical location.

The positioning system 172 may also include other devices in communication with the computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing device 110, other computing devices and combinations of the foregoing.

The perception system 174 also includes one or more components for detecting objects external to the vehicle such as other vehicles, obstacles in the roadway, traffic signals, signs, trees, etc. For example, the perception system 174 may include LIDARs, sonar, radar, cameras and/or any other detection devices that record data which may be processed by the computing devices of the computing devices 110. In the case where the vehicle is a passenger vehicle such as a minivan, the minivan may include a laser or other sensors mounted on the roof or other convenient location.

Figure 2:
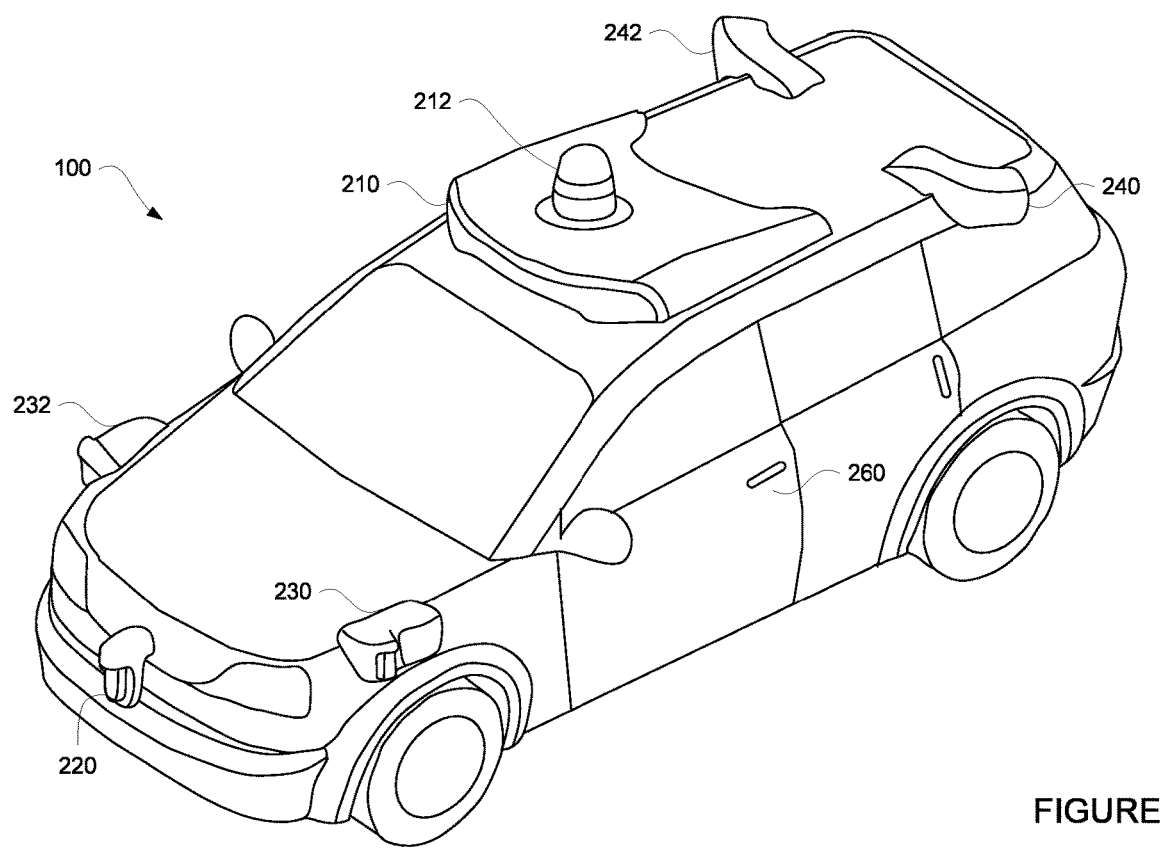
FIG. 2 is an example external view of a vehicle in accordance with aspects of the disclosure.

For instance, FIG. 2 is an example external view of autonomous vehicle 100. In this example, roof-top housing 210 and dome housing 212 may include a LIDAR sensor as well as various cameras and radar units. In addition, housing 220 located at the front end of autonomous vehicle 100 and housings 230, 232 on the driver's and passenger's sides of the vehicle may each store a LIDAR sensor. For example, housing 230 is located in front of driver door 260. Autonomous vehicle 100 also includes housings 240, 242 for radar units and/or cameras also located on the roof of autonomous vehicle 100. Additional radar units and cameras (not shown) may be located at the front and rear ends of autonomous vehicle 100 and/or on other positions along the roof or roof-top housing 210.

The computing devices 110 may be capable of communicating with various components of the vehicle in order to control the movement of autonomous vehicle 100 according to primary vehicle control code of memory of the computing devices 110. For example, returning to FIG. 1, the computing devices 110 may include various computing devices in communication with various systems of autonomous vehicle 100, such as deceleration system 160, acceleration system 162, steering system 164, signaling system 166, planning system 168, routing system 170, positioning system 172, perception system 174, behavior modeling system 176, and power system 178 (i.e. the vehicle's engine or motor) in order to control the movement, speed, etc. of autonomous vehicle 100 in accordance with the instructions 134 of memory 130.

The various systems of the vehicle may function using autonomous vehicle control software in order to determine how to and to control the vehicle. As an example, a perception system software module of the perception system 174 may use sensor data generated by one or more sensors of an autonomous vehicle, such as cameras, LIDAR sensors, radar units, sonar units, etc., to detect and identify objects and their characteristics. These characteristics may include location, type, heading, orientation, speed, acceleration, change in acceleration, size, shape, etc. In some instances, characteristics may be input into a behavior prediction system software module of the behavior modeling system 176 which uses various behavior models based on object type to output a predicted future behavior for a detected object. In other instances, the characteristics may be put into one or more detection system software modules, such as a traffic light detection system software module configured to detect the states of known traffic signals, construction zone detection system software module configured to detect construction zones from sensor data generated by the one or more sensors of the vehicle as well as an emergency vehicle detection system configured to detect emergency vehicles from sensor data generated by sensors of the vehicle. Each of these detection system software modules may use various models to output a likelihood of a construction zone or an object being an emergency vehicle. Detected objects, predicted future behaviors, various likelihoods from detection system software modules, the map information identifying the vehicle's environment, position information from the positioning system 170 identifying the location and orientation of the vehicle, a destination location or node for the vehicle as well as feedback from various other systems of the vehicle may be input into a planning system software module of the planning system 168. The planning system 168 may use this input to generate trajectories for the vehicle to follow for some brief period of time into the future based on a route generated by a routing module of the routing system 170. In this regard, the trajectories may define the specific characteristics of acceleration, deceleration, speed, etc. to allow the vehicle to follow the route towards reaching a destination. A control system software module of the computing devices 110 may be configured to control movement of the vehicle, for instance by controlling braking, acceleration and steering of the vehicle, in order to follow a trajectory.

The computing devices 110 may control the vehicle in an autonomous driving mode by controlling various components. For instance, by way of example, the computing devices 110 may navigate the vehicle to a destination location completely autonomously using data from the detailed map information and planning system 168. The computing devices 110 may use the positioning system 170 to determine the vehicle's location and perception system 174 to detect and respond to objects when needed to reach the location safely. Again, in order to do so, computing device 110 and/or planning system 168 may generate trajectories and cause the vehicle to follow these trajectories, for instance, by causing the vehicle to accelerate (e.g., by supplying fuel or other energy to the engine or power system 178 by acceleration system 162), decelerate (e.g., by decreasing the fuel supplied to the engine or power system 178, changing gears, and/or by applying brakes by deceleration system 160), change direction (e.g., by turning the front or rear wheels of autonomous vehicle 100 by steering system 164), and signal such changes (e.g., by lighting turn signals) using the signaling system 166. Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 4:
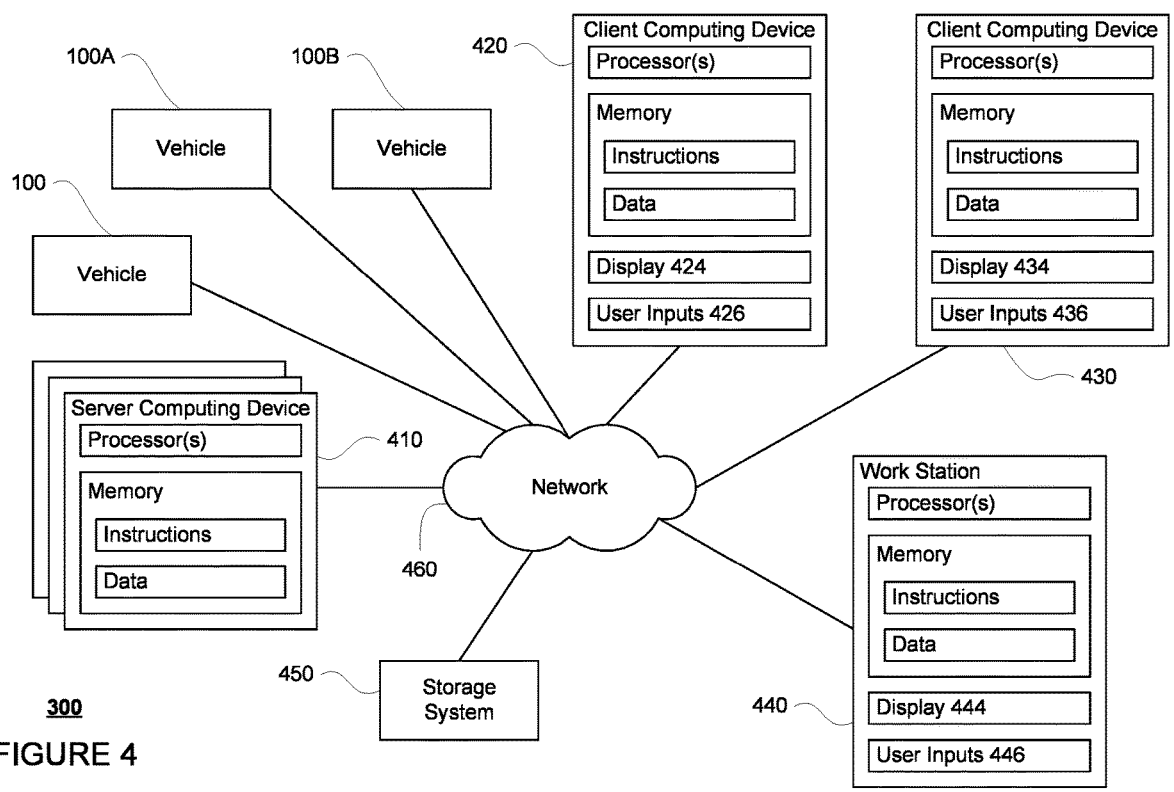
FIG. 4 is a functional diagram of the system of FIG. 4 in accordance with aspects of the disclosure.
Figure 5:
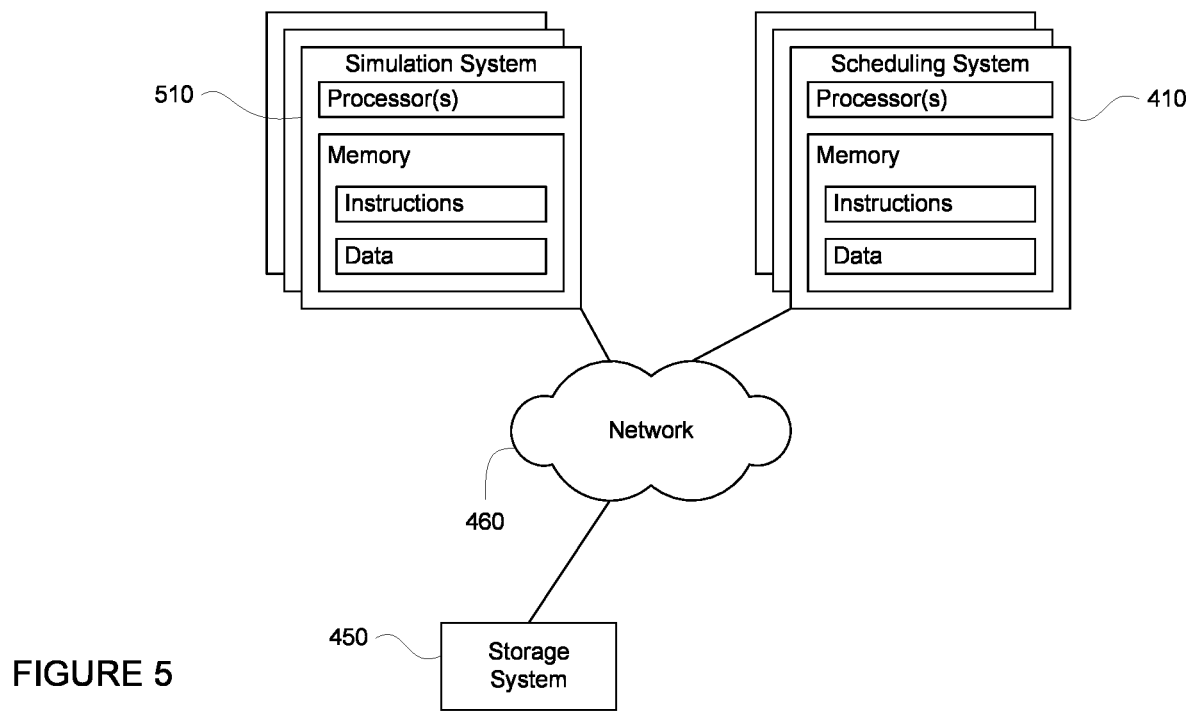
FIG. 5 depicts an example representation of a system in accordance with aspects of the disclosure.

Computing device 110 of autonomous vehicle 100 may also receive or transfer information to and from other computing devices, such as those computing devices that are a part of the transportation service as well as other computing devices. FIGS. 4 and 5 are pictorial and functional diagrams, respectively, of an example system 300 that includes a plurality of computing devices 410, 420, 430, 440 and a storage system 450 connected via a network 460. System 300 also includes autonomous vehicle 100A and autonomous vehicle 100B, which may be configured the same as or similarly to autonomous vehicle 100. Although only a few vehicles and computing devices are depicted for simplicity, a typical system may include significantly more.

As shown in FIG. 4, each of computing devices 410, 420, 430, 440 may include one or more processors, memory, data and instructions. Such processors, memories, data and instructions may be configured similarly to one or more processors 120, memory 130, data 132, and instructions 134 of computing device 110.

The network 460, and intervening graph nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of autonomous vehicle 100 or a similar computing device of autonomous vehicle 100A or autonomous vehicle 100B as well as computing devices 420, 430, 440 via the network 460. For example, autonomous vehicles 100, 100A, 100B, may be a part of a fleet of vehicles that can be dispatched by server computing devices to various locations. In this regard, the server computing devices 410 may function as a scheduling system which can be used to arrange trips for passengers by assigning and dispatching vehicles such as autonomous vehicles 100, 100A, 100B. These assignments may include scheduling trips to different locations in order to pick up and drop off those passengers. In this regard, the server computing devices 410 may operate using scheduling system software in order to manage the aforementioned autonomous vehicle scheduling and dispatching. In addition, the computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

Figure 3:
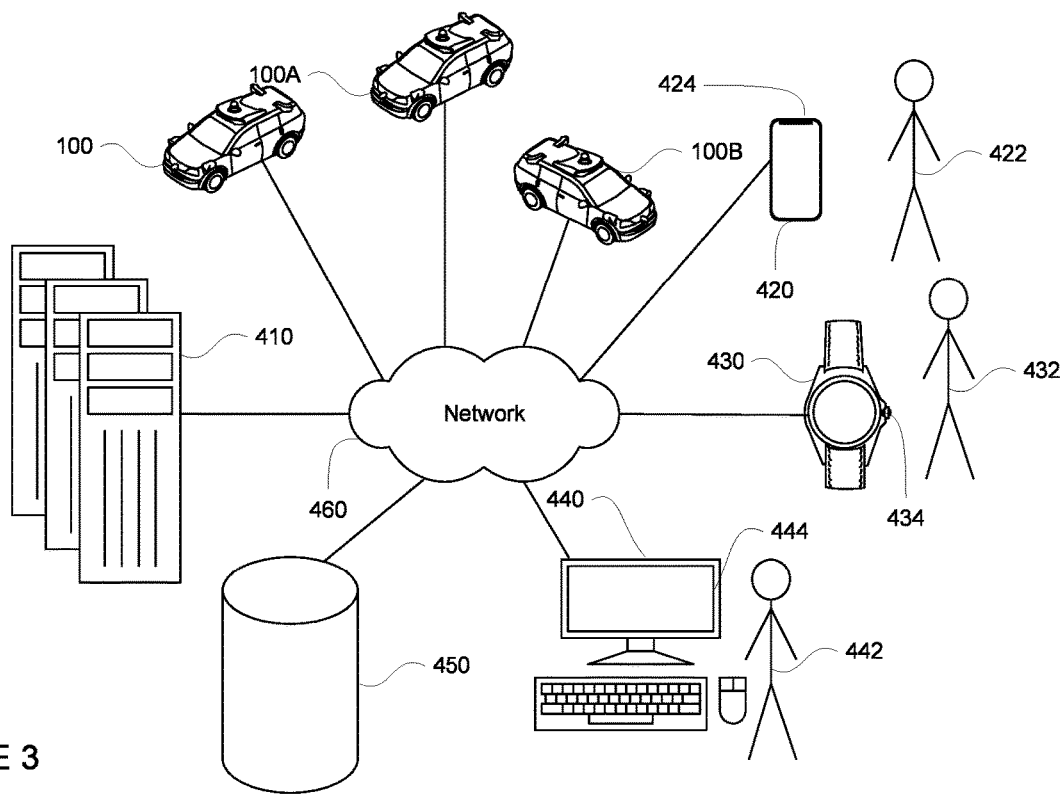
FIG. 3 is a pictorial diagram of an example system in accordance with aspects of the disclosure.

As shown in FIG. 3, each client computing device 420, 430 may be a personal computing device intended for use by a user 422, 432 and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 3. As an example the user may input information using a small keyboard, a keypad, microphone, using visual signals with a camera, or a touch screen. As yet another example, client computing device 440 may be a desktop computing system including a keyboard, mouse, camera and other input devices.

Each of the client computing devices may be remote computing device used by a person (e.g. human operators or users 422, 432, 442) to review and analyze sensor data and other information generated by a perception system of a vehicle such as perception system 174 of autonomous vehicle 100. For example, user 442 may use the client computing device 440 to provide input to the simulation system 510 as discussed further below. Although only a few remote computing devices are shown in FIGS. 3 and 4, any number of such work stations may be included in a typical system.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 3 and 4, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For example, the storage system 450 may also store a version of the aforementioned detailed map information including all or some of the features discussed herein.

For instance, storage system 450 may store log data. This log data may include data generated by the various systems of a vehicle, such as autonomous vehicle 100, while the vehicle is being operated in a manual driving mode or an autonomous driving mode. For instance, the log data may include sensor data generated by a perception system, such as perception system 174 of autonomous vehicle 100. As an example, the sensor data may include raw sensor data as well as labels identifying defining characteristics of perceived objects such as shape, location, orientation, speed, etc. of objects such as vehicles, pedestrians, bicyclists, vegetation, curbs, lane lines, sidewalks, crosswalks, buildings, etc. The labels themselves may be generated and applied by an autonomous vehicle's perception system, such as perception system 174 of autonomous vehicle 100, for instance, using machine learned models trained on human labeled data. Alternatively, if the simulation is based on simulated log data generated in part by human operators, the label identifying an open door may be applied by a human operator.

The log data may also include "event" data identifying different types of events such as collisions or near collisions with other objects, planned trajectories describing a planned geometry and/or speed for a potential path of the vehicle, actual locations of the vehicle at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, planning, power, etc.) of the vehicle at different times including logged errors, inputs to and outputs of the various systems of the vehicle at different times, etc.

The storage system may also store a plurality of different types of assets in order to reconstruct a virtual scene may be reconstructed from the aforementioned log-data (and/or other simulated log data), and so that objects in the simulated autonomous vehicle's environment can be positioned relative to the simulated autonomous vehicle as they were to the autonomous vehicle that collected the log data. The storage system may store assets such as pedestrian, bicyclist, and vehicle assets each have a specified shape and size (e.g. dimensions) which can be used to reconstruct a virtual scene for a simulation. In some instances, certain types of assets may have relationships with other types of assets. For example, a vehicle asset may have a relationship with an open-door object which defines the shape and size of an appropriately sized open-door for the related vehicle object. This relationship may be a simple association (e.g. a pointer) but may also include other information such as the exact position for the door asset relative to the vehicle. For instance, the location of the open door relative to the vehicle (e.g. driver/left, rear/left, passenger/right, rear/right, etc.) may be used to select a specific door asset or simply how to flip/place the door asset relative to the vehicle In order to run the aforementioned simulations, a simulation system may be used to interact with the server computing devices 410. FIG. 6 depicts an example representation of a system including a simulation system 510 which can communicate with the computing devices 410 and storage system 450, for instance, via the network 460 or another network. In this regard, the simulation system may also be able to communicate with other computing devices, such as computing devices 420, 430 in order to receive input from a human operator such as user 442.

The simulation system 510 may be configured similarly to the server computing devices 410, and may therefore include one or more server computing devices each having one or more processors, memory, data and instructions. As with the server computing devices 410, such processors, memories, data and instructions may be configured similarly to one or more processors 120, memory 130, data 132, and instructions 134 of computing device 110. For instance, the simulation system 510 may include one or more server computing devices that are capable of simulating one or more autonomous vehicles operating using the aforementioned autonomous vehicle control software which can operate to control a respective simulated autonomous vehicle in an autonomous driving mode in a simulation in response to instructions from the server computing devices 410 (e.g. the scheduling system).

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

Figure 13:
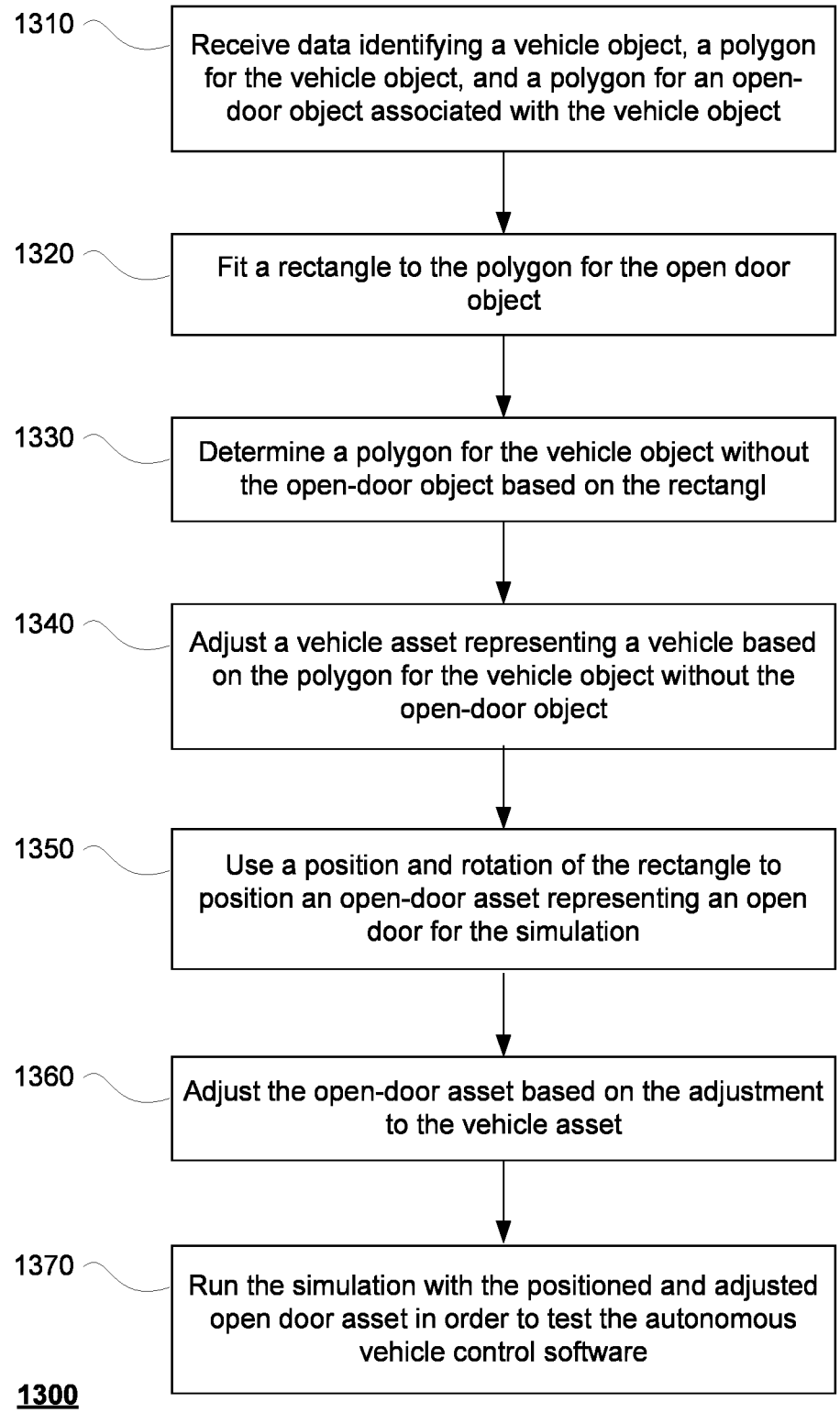
FIG. 13 is an example flow diagram in accordance with aspects of the disclosure.

FIG. 13 is an example flow diagram 1300 for generating assets for a simulation in order to test autonomous vehicle control software, which may be performed by one or more processors of one or more computing devices, such as the processors of the simulation system 510 or the processors of any of the server computing devices 410 or client computing devices 420, 430, 440. At block 1310, data identifying a vehicle object, a polygon for the vehicle object, and a polygon for an open-door object associated with the vehicle object is received.

For instance, the simulation system 510 may access the log data from the storage system 450 and retrieve or receive data identifying a vehicle object. As noted above, the log data may identify the relative position, orientation, size and shape or contour of vehicle objects. The size shape and contour of the vehicle object may be represented by a three-dimensional bounding box representing the volume of space occupied by an object, a polygon representing the contour (e.g. two-dimensional top-down contour) for the vehicle object, as well as the three-dimensional sensor data points corresponding to that object.

Figure 6A:
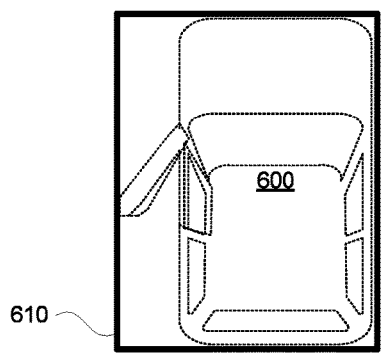
FIGS. 6A-6C are example representations of sensor data, a bounding box, and polygons in accordance with aspects of the disclosure.
Figure 6B:
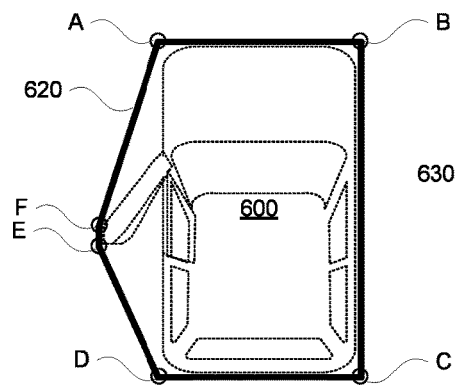
Figure 6C:
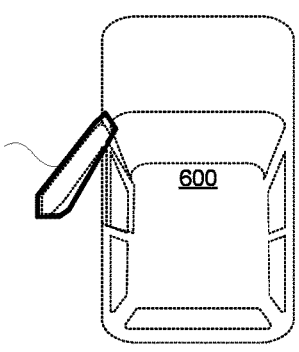

FIGS. 6A-6C represent sensor data 600, a bounding box 610, and polygons 620, 630 for a vehicle object and an open-door object detected by a perception system such as perception system 174 of autonomous vehicle 100. In these examples, the sensor data 600 may include LIDAR sensor data representing locations and intensity of light reflect off of surfaces of the vehicle object. FIG. 6A represents sensor data 600 corresponding to a vehicle object in log data. In this example, the bounding box 610 represents a bounding box for the sensor data. As depicted, the bounding box represents a volume of space (only two-dimensions depicted) for the vehicle object. FIG. 6B represents a polygon 620 representing a two-dimensional contour for the sensor data 600. In this example, polygon 620 includes 6 vertices, here labeled as vertices A, B, C, D, E and depicted within open circles for ease of understanding. Each of the bounding box and polygon 620 may be stored in the log data.

In addition, the log data may include a label identifying whether or not the vehicle has an open door as well as a three-dimensional bounding box representing the volume of space occupied by the open-door object as well as a polygon representing the contour (e.g. top-down contour) for the vehicle object. As such, the simulation system may analyze the labels for such vehicle objects in the log data and determine whether the vehicle objects include an open door. If so, the simulation system may attempt to create a representation of those open doors for the simulation. In this regard, the bounding box 610 of FIG. 6A may also include three-dimensional sensor data points for an open-door object. Or rather, the sensor data 600 may also include data points for an open door of the vehicle object. In this example, FIG. 6C represents a polygon representing the contour for an open-door object which may also be included in the log data.

Returning to FIG. 13, at block 1320, a rectangle is fit to the polygon for the open-door object. Once the simulation system 510 has determined that a vehicle object has an open door, the simulation system may determine the properties of the door (e.g. which door and how far open) in order to better represent the open door in the scene. To do so, a rectangle may be fit to the contour polygon representing the door. In other words, a smallest rectangle that fits around the polygon may be determined. The position and rotation of the rectangle may be used as a proxy for the properties of the open-door object in the simulation as discussed further below. For instance, turning to FIG. 7, a rectangle 730 is fit to the polygon 630. Again, the position and rotation of the rectangle 730 may be used as a proxy for the position and rotation of the open-door object in a simulation. Alternatively, a more complex polygon (e.g. one with more than 4 vertices) may be fit to the polygon for the open-door object associated with the vehicle object and then used as described with respect to the rectangle below.

Returning to FIG. 13, at block 1330, a polygon for the vehicle object without the open-door object is determined based on the rectangle. Because the polygon representing the vehicle object also includes the door object, the two must be distinguished or separated out from one another in order to properly reconstruct the objects separately for the simulation. As such, vertices corresponding to the open door may be removed, filtered or otherwise discarded from the vertices of the polygon representing the combined vehicle object and the door object in order to identify a new polygon. To do so, any vertices which fall into the space of the open-door rectangle (and/or the polygon) may be removed. The remaining sensor vertices may be used to draw the new polygon contour for the vehicle object (without the open-door object). This may result in a reduced or smaller polygon.

Figure 7:
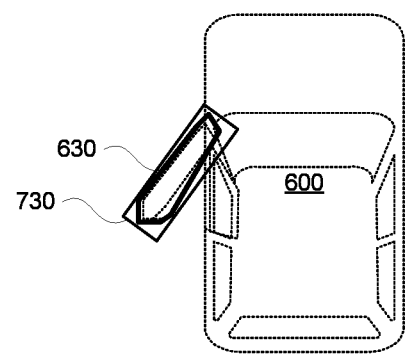
FIG. 7 is a representation of a rectangle fit to a polygon and sensor data in accordance with aspects of the disclosure.

In some instances, when removing sensor data points, the size of the rectangle (and or polygon) may be increased by some small amount, such as 1, 5, 10, 15 centimeters or more or less, in order to ensure that sensor data points along the edges of the polygon for the door object are also captured. In this regard, as shown in FIG. 7, the rectangle 730 may be increased in size relative to the polygon 630.

Figure 8:
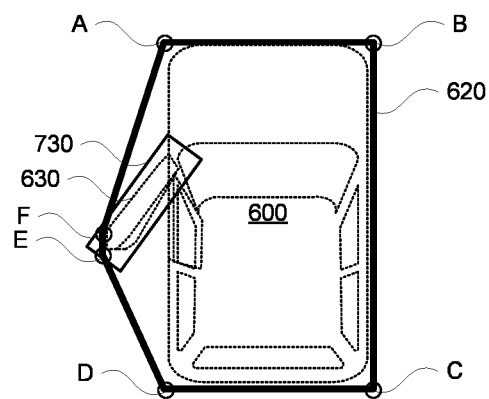
FIG. 8 is an example representation of sensor data, polygons and a rectangle in accordance with aspects of the disclosure.
Figure 9:
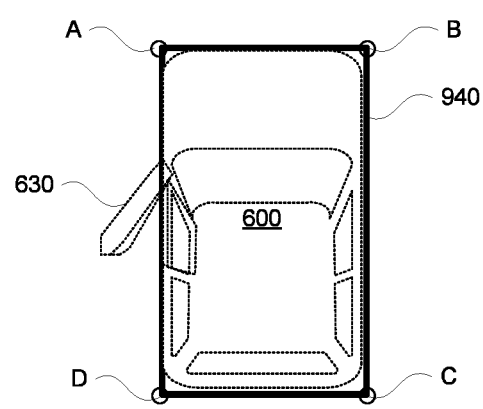
FIG. 9 is an example representation of sensor data, a rectangle, and a polygon in accordance with aspects of the disclosure.

Turning to FIG. 8, a pair of vertices, here vertices E and F (again depicted within respective open circles for ease of understanding) of the polygon 620 (corresponding to the door object) within the rectangle 730 is removed or ignored. Turning to FIG. 9 he remaining vertices, vertices A, B, C and D, are used to determine or draw a new polygon 940. As a result, new polygon 940 represents the contour of the vehicle object without the open-door object. This new polygon 940 may be a rectangle or may be a more detailed contour with additional vertices. The portion of the sensor data 600 may also be used to determine a bounding box for the vehicle object without the open-door object. As this bounding box may be three-dimensional, in a top-down view, it may appear similar to the new polygon 940 depicted in FIG. 9.

Returning to FIG. 13, at block 1340, a vehicle asset representing a vehicle is adjusted based on the polygon for the vehicle object without the open-door object. In addition, at block 1350, a position and rotation of the rectangle is used to position an open-door asset representing an open door in the simulation. As noted above, the simulation system may use the dimensions of the bounding box for the vehicle object without the open-door object to select a vehicle asset representing a vehicle object from a plurality of vehicle assets pre-stored in a storage system. The size of the vehicle asset may then be adjusted to a size that best fits the bounding box for the vehicle object without the open-door object, and the adjusted vehicle asset may be placed into the scene for the simulation. The adjustment may include increasing or decreasing one or more of the length, width, or height of the vehicle. The position and rotation of the bounding box for the vehicle object may be used to position the adjusted vehicle asset in the simulation.

Figure 10:
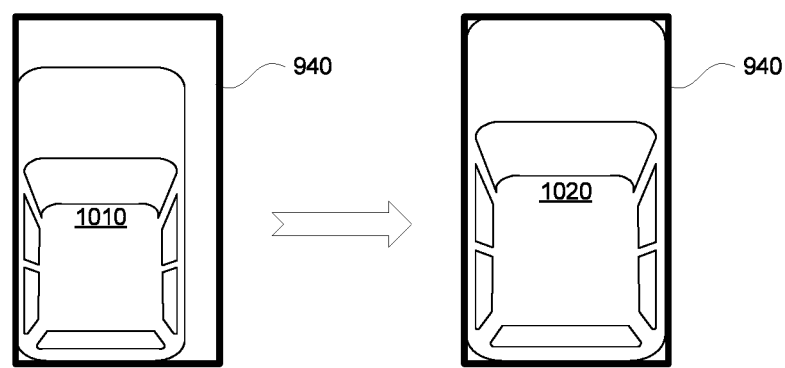
FIG. 10 is an example representation of adjusting a vehicle asset in accordance with aspects of the disclosure.

FIG. 10 depicts a vehicle asset 1010 which may be identified from the storage system 450 based on the shape and size of the bounding box for the vehicle object without the open-door object. For example, vehicle asset 1010 may be the closest in dimensions to the bounding box for the vehicle object without the open-door object (represented in two-dimensions by the new polygon 940 for simplicity). The vehicle asset 1010 may then be resized or adjusted, for instance in length or width (as shown in FIG. 10) and/or height to better fit the bounding box for the vehicle object without the open-door object as depicted by adjusted vehicle asset 1020.

Returning to FIG. 13, at block 1360, the open-door asset is adjusted based on the adjustment to the vehicle asset. The simulation system 510 may also identify a door asset from the storage system based on a relationship with the vehicle asset for the vehicle object with the open door. Before placing the door asset in the scene, the door asset may be adjusted using the same adjustment that was made to the vehicle asset. In this regard, the door asset may be properly sized for the vehicle asset in the scene. This may provide better, more realistic results than attempting to size the door asset to the sensor data points or bounding box itself. The position and rotation of the door rectangle may be used to position the adjusted door asset relative to the adjusted vehicle asset.

Figure 11:
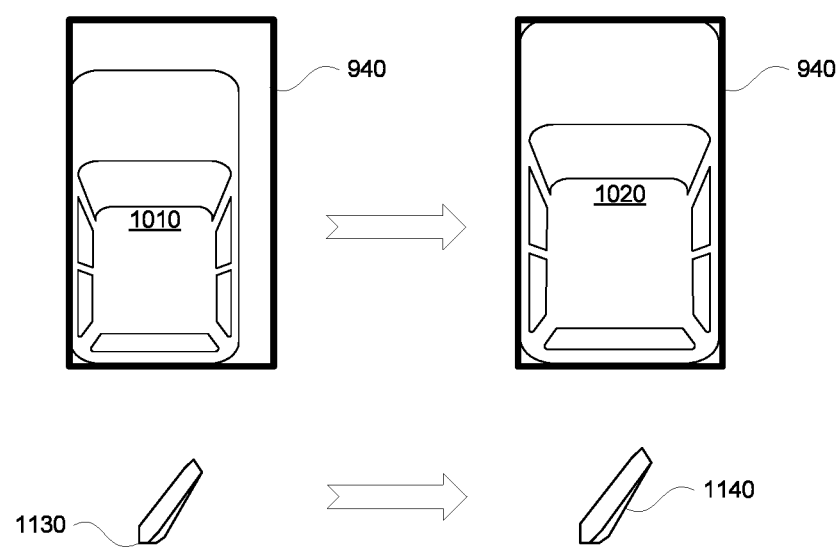
FIG. 11 is an example representation of adjusting an open-door asset in accordance with an adjustment to a vehicle asset in accordance with aspects of the disclosure.

FIG. 11 depicts the vehicle asset 1010 and adjusted vehicle asset 1020 as well as an open-door asset 1130 which may be identified from the storage system 450 based on a relationship with the vehicle asset 1010. The open-door asset 1130 may then be resized or adjusted, for instance in length or width (as shown in FIG. 11) and/or height according to the adjustments made to the vehicle asset 1010 to result in the adjusted vehicle asset 1020. In this example, the open-door asset 1130 is adjusted accordingly resulting in the adjusted open-door asset 1140.

Figure 12:
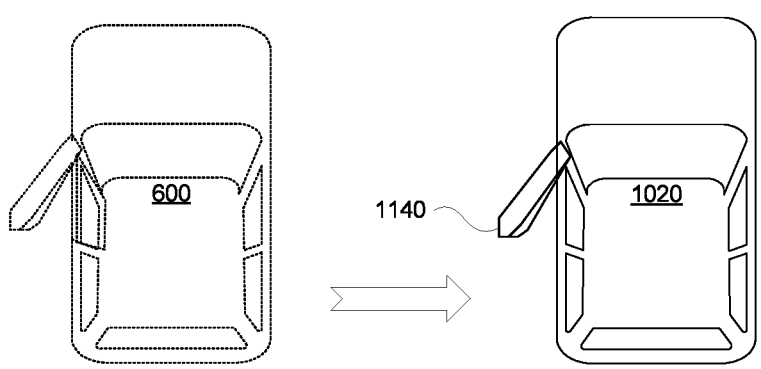
FIG. 12 is an example of sensor data as well as a vehicle asset and an open-door asset for a simulation in accordance with an aspect of the disclosure.

As shown in FIG. 12, the adjusted vehicle asset 1020 and the adjusted open-door asset 1140 may then be positioned relative to one another and within a virtual scene based on the position of the vehicle object in the log data as well as the position and rotation of the rectangle 730 of FIG. 7. FIG. 12 also depicts sensor data 600 for the vehicle object with the open-door object for comparative purposes.

Returning to FIG. 13, at block 1370, the simulation is run with the positioned and adjusted open door asset in order to test the autonomous vehicle control software. The open-door asset and vehicle asset may be one small part of a virtual scene reconstructed from the log data (or simulated log-data). In this regard, the virtual scene may be reconstructed from the aforementioned log-data (and/or other simulated data) so that objects in the simulated autonomous vehicle's environment can be positioned relative to the simulated autonomous vehicle as they were to the autonomous vehicle that collected the log data. a simulation may then be run to test the autonomous vehicle control software using the vehicle asset, door asset, and the bounding box for the vehicle object without the open-door object.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method comprising:
receiving, by one or more processors, first data identifying a vehicle, the vehicle having an open door associated therewith;
receiving, by the one or more processors, second data identifying a first polygon corresponding to the vehicle and the open door, and a second polygon corresponding to the open door;
fitting, by the one or more processors, a rectangle to the second polygon;
determining, by the one or more processors based on the rectangle, a third polygon corresponding to the vehicle and excluding the open door;
adjusting, by the one or more processors, one or more parameters of a vehicle asset based on a size of the third polygon, the vehicle asset representing the vehicle;
positioning, by the one or more processors, an open-door asset based on a position and a rotation of the rectangle, the open-door asset representing the open door;
adjusting, by the one or more processors, one or more parameters of the open-door asset based on the adjustment of the one or more parameters of the vehicle asset; and
running, by the one or more processors, a simulation with the positioned open-door asset and the adjusted one or more parameters of the open-door asset in order to test autonomous vehicle control software.

2. The method of claim 1, wherein the positioning of the open-door asset occurs before the adjusting of the one or more parameters of the open-door asset.

3. The method of claim 1, wherein the positioning of the open-door asset occurs after the adjusting of the one or more parameters of the open-door asset.

4. The method of claim 1, further comprising, receiving sensor data points corresponding to the vehicle and the open door, wherein the determining the third polygon further includes removing ones of the sensor data points within the rectangle.

5. The method of claim 1, further comprising, receiving sensor data points corresponding to the vehicle and the open door, wherein the determining the third polygon further includes:
increasing the size of the rectangle; and
removing ones of the sensor data points within the rectangle having the increased size.

6. The method of claim 1, wherein the first data is log data generated by the vehicle or a different vehicle collecting third data while driving in an autonomous driving mode.

7. The method of claim 1, wherein the first data is simulated log data generated in part by human operators.

8. The method of claim 1, wherein the third polygon is a different rectangle than the rectangle.

9. A system comprising one or more processors configured to:
receive first data identifying a vehicle, the vehicle having an open door associated therewith;
receive second data identifying a first polygon corresponding to the vehicle and the open door, and a second polygon corresponding to the open door;
fit a rectangle to the second polygon;
determine, based on the rectangle, a third polygon corresponding to the vehicle and excluding the open door;
adjust one or more parameters of a vehicle asset based on a size of the third polygon, the vehicle asset representing the vehicle;
position an open-door asset based on a position and a rotation of the rectangle, the open-door asset representing the open door;
adjust one or more parameters of the open-door asset based on the adjustment of the one or more parameters of the vehicle asset; and
run a simulation with the positioned open-door asset and the adjusted one or more parameters of the open-door asset in order to test autonomous vehicle control software.

10. The system of claim 9, wherein the one or more processors are further configured to position the open-door asset occurs before the adjustment of the one or more parameters of the open-door asset.

11. The system of claim 9, wherein the one or more processors are further configured to position the open-door asset occurs after the adjustment of the one or more parameters of the open-door asset.

12. The system of claim 9, wherein the one or more processors are further configured to receive sensor data points corresponding to the vehicle and the open door, and to determine the third polygon further by removing ones of the sensor data points within the rectangle.

13. The system of claim 9, wherein the one or more processors are further configured to, receive sensor data points corresponding to the vehicle and the open door, and to determine the third polygon further by:
increasing the size of the rectangle; and
removing ones of the sensor data points within the rectangle having the increased size.

14. The system of claim 9, wherein the first data is log data generated by the vehicle or a different vehicle collecting third data while driving in an autonomous driving mode.

15. The system of claim 9, wherein the first data is simulated log data generated in part by human operators.

16. The system of claim 9, wherein the third polygon different rectangle than the rectangle.

17. A non-transitory recording medium on which instructions are stored, the instructions, when executed by one or more processors, cause the one or more processors to perform a method comprising:
receiving first data identifying a vehicle, the vehicle having an open door associated therewith;
receive second data identifying a first polygon corresponding to the vehicle and the open door, and a second polygon corresponding to the open door;
fitting a rectangle to the second polygon;
determining, based on the rectangle, a third polygon corresponding to the vehicle and excluding the open door;
adjusting one or more parameters of a vehicle asset based on a size of the third polygon, the vehicle asset representing the vehicle;
positioning an open-door asset based on a position and a rotation of the rectangle, the open-door asset representing the open door;

adjusting one or more parameters of the open-door asset based on the adjustment of the one or more parameters of the vehicle asset; and running a simulation with the positioned open-door asset and the adjusted one or more parameters of the open-door asset in order to test the autonomous vehicle control software.

18. The medium of claim 17, wherein the method further comprises, receiving sensor data points corresponding to the vehicle and the open door, wherein the determining the third polygon further includes removing ones of the sensor data points within the rectangle.

19. The medium of claim 17, wherein the method further comprises, receiving sensor data points corresponding to the vehicle and the open door, wherein the determining the third polygon further includes:

increasing the size of the rectangle; and removing ones of the sensor data points within the rectangle having the increased size.

20. The medium of claim 17, wherein the first data is log data generated by a vehicle collecting data while driving in an autonomous driving mode.

\* \* \* \* \*

UNITED STATES PATENT AND TRADEMARK OFFICE
CERTIFICATE OF CORRECTION

| | |
|---|---|
| PATENT NO. | : 12,085,935 B2 |
| APPLICATION NO. | : 17/389626 |
| DATED | : September 10, 2024 |
| INVENTOR(S) | : Evan Birenbaum and Xiaoyi Liu |

It is certified that error appears in the above-identified patent and that said Letters Patent is hereby corrected as shown below:

In the Claims

Claim 17, Column 19, Lines 6 and 7:
Now reads: "test the autonomous vehicle control software" should read -- test autonomous vehicle control software --

Signed and Sealed this
Fifteenth Day of October, 2024

Katherine Kelly Vidal
*Director of the United States Patent and Trademark Office*